United States Patent [19]

Mosley, Jr. et al.

[11] 4,159,526

[45] Jun. 26, 1979

[54] DIGITALLY CONTROLLED VARIABLE FREQUENCY OSCILLATOR

[75] Inventors: William H. Mosley, Jr., St. Petersburg; Eugene R. Wade, Melbourne, both of Fla.

[73] Assignee: NCR Corporation, Dayton, Ohio

[21] Appl. No.: 822,593

[22] Filed: Aug. 8, 1977

[51] Int. Cl.² ............................ G06F 1/02; G06J 1/00
[52] U.S. Cl. ...................................... 364/721; 328/14; 364/607
[58] Field of Search ................ 364/721, 607; 328/14; 331/179; 332/23 A

[56] References Cited

U.S. PATENT DOCUMENTS

| 3,568,069 | 3/1971 | Gabor | 328/14 |
| 3,633,017 | 1/1972 | Crooke et al. | 364/721 |
| 3,649,821 | 3/1972 | Gumacos | 364/721 |
| 3,980,971 | 9/1976 | Sato | 332/23 A X |

OTHER PUBLICATIONS

Tierney et al., "A Digital Frequency Synthesizer", *IEEE Trans. on Audio and Electroacoustics*, vol. AU-19, No. 1, Mar. 1971, pp. 48-57.

*Primary Examiner*—David H. Malzahn
*Attorney, Agent, or Firm*—J. T. Cavender; Edward Dugas

[57] ABSTRACT

A variable frequency oscillator is disclosed wherein the magnitude of a signed digital input determines the output frequency. The variable oscillator includes a digital integrator circuit for performing a modulo $2\pi$ digital integration of the input signal. The integrator circuit is connected to a digital quadrature circuit which converts the integrated input signal from its polar form into two digital control signals in the rectangular domain having a quadrature phase relationship. The control signals are utilized in analog form by their combination with a high frequency carrier and its quadrature phase to synthesize the desired output frequency in an analog embodiment. According to another embodiment the quadrature synthesis is provided by the digital combination of the control signals and the phased carrier components.

6 Claims, 7 Drawing Figures

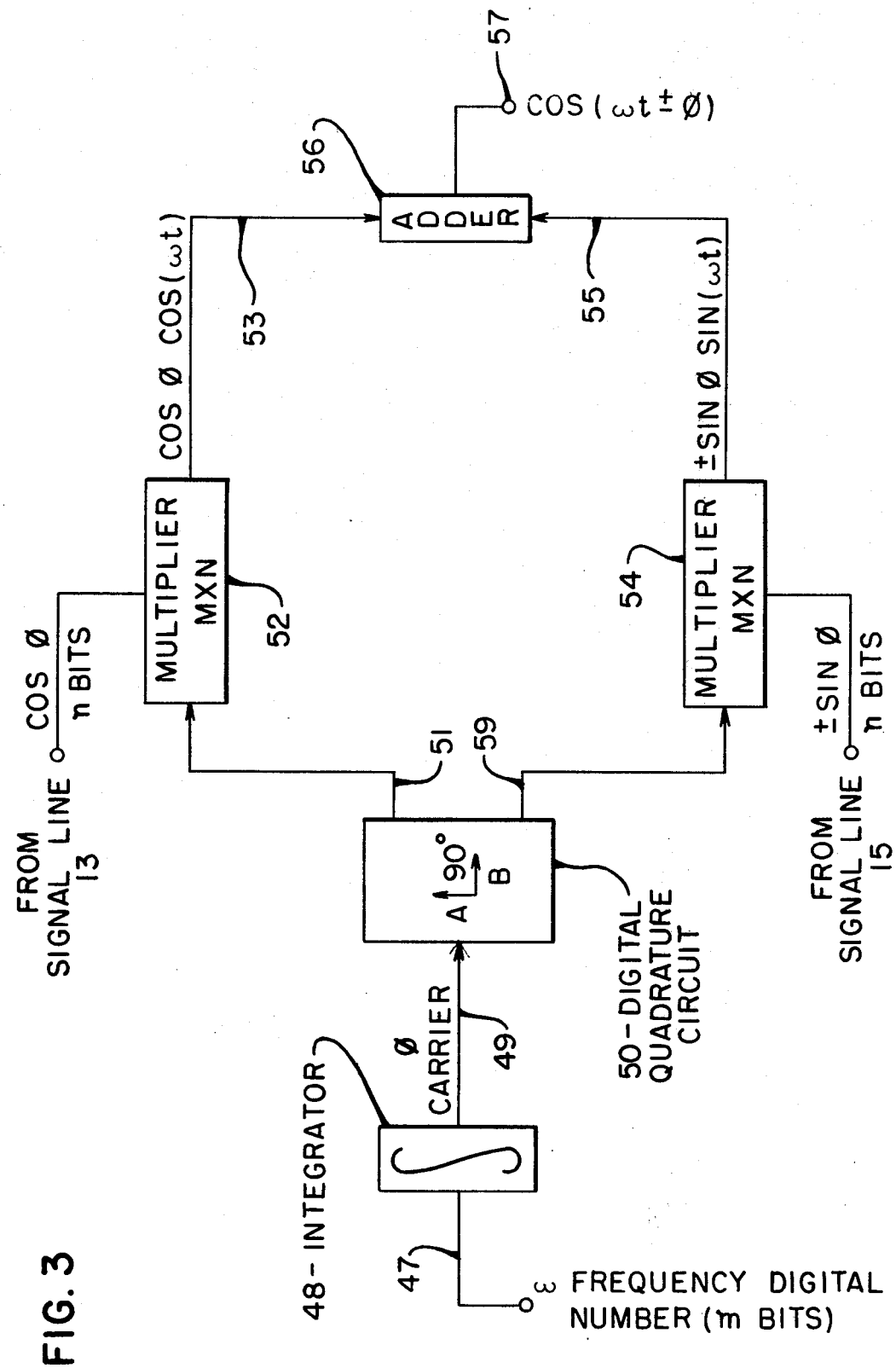

$\Delta\emptyset = \dfrac{2\pi}{16}$ $\omega i = \dfrac{\Delta\emptyset}{\Delta t}$ $\Delta\emptyset \text{ MAX} = 2\pi$ $\Delta\emptyset \text{ MIN} = \dfrac{2\pi}{2^n}$

DIGITALLY CONTROLLED VARIABLE FREQUENCY OSCILLATOR

BACKGROUND OF THE INVENTION

The invention pertains generally to variable frequency oscillators and is more specifically directed to digitally controlling an output frequency of such oscillators.

Generally, circuits termed as variable frequency oscillators (VFO) have found wide use in the electronics art. These oscillators are generally characterized by operation in the high frequency band to provide a carrier frequency. An input parameter is used to vary the carrier several KHz on either side of its center frequency with the variations being generally linearly related to the input parameter.

Primarily, the utility of such devices is found in angular modulators of both the frequency and phase configurations and their corresponding demodulators. The growing use of the phase locked loop in many applications will however increase their use in the future as the VFO forms an important component of such circuits.

One particularly advantageous method of generating a variable frequency output is by quadrature synthesis. In this method an input information signal and its quadrature are combined with a carrier and its quadrature according to a trignometric identity to form the desired output frequency. For example, a time varying output signal for a variable frequency oscillator may be represented as:

$$V(t) = A \cos(wt \pm \phi) \quad (1)$$

If A and $\phi$ are constants, then this equation describes a singular frequency sinusoid of angular frequency w. However, the frequency of the sinusoid may also change according to $\phi(t)$ because $$Wi = d\phi/dt \quad (2)$$

where Wi is the instantaneous change in frequency due to the time change of the phase angle $\phi$. Thus the total angular frequency of the sinusoid is:

$$Wt = W + Wi \quad (3)$$

Therefore by controlling the phase angle $\phi$ it is possible to control the output frequency of an oscillator. An identical expression for equation (1) from manipulation with trigonometric identities becomes:

$$V(t) = \cos\phi \cos(wt) \pm \sin\phi \sin(wt) \quad (4)$$

Therefore from equations 3 and 4 a variable frequency can be formed by combining the quadrature components of a control signal $\phi(t)$ with the quadrature components of a carrier of angular frequency W.

U.S. Pat. No. 2,431,569 entitled "Frequency Modulation," issued to E. Labin, and U.S. Pat. No. 3,225,316 entitled "Phase-Shift Single Side-Band Modulators," issued to W. Saraga, illustrate angular modulators using quadrature combinational circuitry.

While the quadrature syntheses for a variable frequency oscillator as described above would be advantageous in many respects, there is some difficulty in the generation of the quadrature phases of $\phi(t)$, especially if the control signal is broadbanded. The multiplicity of differing frequencies that form a broadband signal do not lend themselves to a simple conversion into quadrature components by a single passive phase shift network.

As a consequence, if the synthesis is to be used, complicated phasing networks such as Hilbert transformers are necessitated. An example of a circuit of the Hilbert type is illustrated in U.S. Pat. No. 3,800,131 entitled "Hilbert Transformer," issued to S. A. White. Other examples of wideband quadrature phasing networks are found in Saraga and Labin, infra. A further difficulty that is encountered in previous quadrature circuits is the omission of the synthesis of the carrier frequency. The carrier frequency and substantially all the synthesized frequencies that fall above or below the carrier frequency are extremely important in many applications. A normal VFO providing phase locking in a phase locked loop would be expected to be able to generate the continuum of frequencies that one might expect to encounter.

SUMMARY OF THE INVENTION

The present invention provides a variable frequency oscillator wherein the magnitude of a signed digital input word determines the output frequency.

The variable frequency oscillator comprises quadrature synthesis circuit means for combining a carrier frequency and its quadrature phase with a control signal and its quadrature phase to synthesize a multiplicity of output frequencies. The oscillator further comprises digital circuit means for generating the control signal and its quadrature phase from an input signal. Also included is a digital integrator circuit means which means performs a modulo $2\pi$ integration of the frequency desired and a digital quadrature circuit means for converting the output of the digital integrator circuit means, which is in polar form, into the two quadrature phases of the control signal in rectangular form.

The digital quadrature circuit means provides a method for the derivation of the control signal and its quadrature phase over a broadband of frequencies without complicated phasing techniques needed by analog circuitry. The resolution and phase correction are substantially similar over the entire band of input frequencies and therefore linearly related as in a theoretical VFO. Each digital input word will be directly converted into a stable and repeatable output frequency as the derivation depends only on the stability of the carrier which can be made extremely accurate.

According to another aspect of the invention the quadrature synthesis circuit means may be formed from either analog or digital circuitry. This aspect provides flexibility in the choice of the carrier frequency as analog components are more readily used for higher frequencies. The digital quadrature synthesis circuit is more advantageously used with general purpose digital processors and at lower frequencies.

Therefore, it is the object of this invention to produce a variable output frequency as a synthesis of a signed digital input and a carrier frequency. It is a further object of the invention to provide a variable output frequency by the quadrature synthesis of a digital number whose magnitude is indicative of the frequency desired and a carrier frequency.

It is still another object of the invention to perform the quadrature synthesis according to the equation:

$$V(t) = \cos\phi \cos wt \pm \sin\phi \sin wt$$

where V(t) is the output synthesized frequency, $\phi$ is the phase function of the digital input signal, and w is the angular carrier frequency.

It is still another object of the invention to provide the quadrature synthesis in a digital form.

It is yet another object of the invention to provide the quadrature synthesis in analog form.

Another object of the invention is to provide for the generation by synthesis of the carrier frequency.

These and other objects of the invention will be more readily understood and apparent when the following detailed description is taken in conjunction with the appended drawings wherein:

BRIEF DESCRIPTION OF THE DRAWINGS

FIG. 3 is a detailed system diagram of another embodiment of the invention; and

DESCRIPTION OF THE PREFERRED EMBODIMENTS

Figure 1:
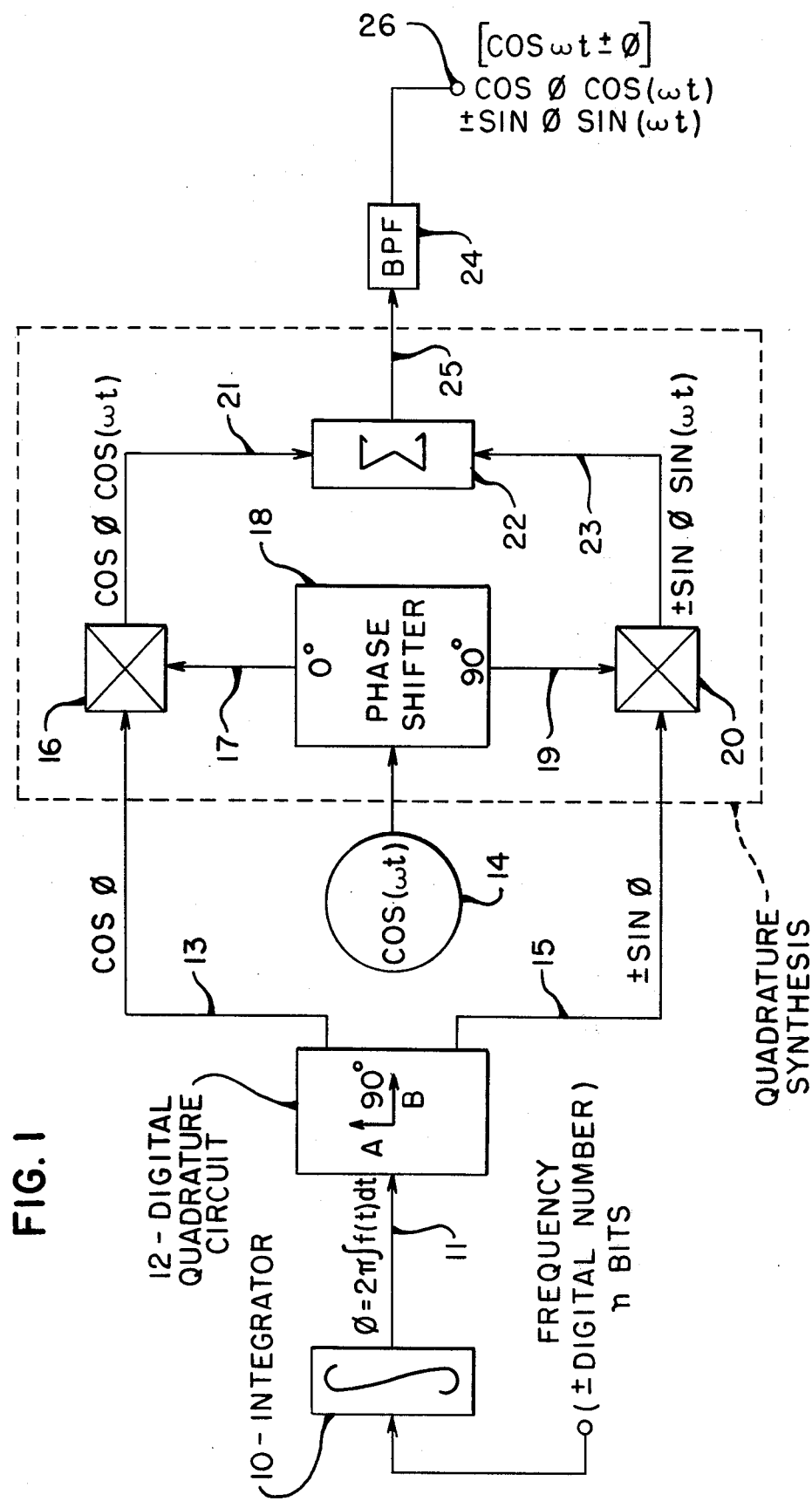
FIG. 1 is a system block diagram of a variable frequency oscillator controlled by digital input numbers and constructed in accordance with the invention.

With reference now directed to FIG. 1 there is illustrated in block diagram form a VFO constructed in accordance with the invention. The VFO comprises in part a digital integrator circuit 10 connected via signal line 11 to a digital quadrature circuit 12. The two outputs of the quadrature circuit 12 are thereafter connected via signal lines 13 and 15 to multiplication circuits 16 and 20, respectively. The multiplication circuits 16 and 20 have additional inputs from a phase shifter circuit 18 via signal lines 17 and 19. The input to the phase shifter is a carrier signal, cos (wt), received from a signal source 14.

Signal line 21 and signal line 23 connect the outputs of the multiplication circuits 16 and 20 to the inputs of a combination circuit 22. In series with the output of the combination circuit 22 and the output terminal 26, of the VFO, is a band pass filter 24.

In operation, the VFO will receive a signed digital number as the input signal to the circuitry and will output a carrier frequency at terminal 26, which carrier frequency is representative of the sign and magnitude of the signed digital number. In the preferred form for positive digital numbers the output frequency will be higher than the carrier frequency 14 and for negative digital numbers the output frequency will be lower although this can be reversed. The use of a signed input number will thus allow double frequency resolution over, for example, the provision for only positive numbers. This in turn will permit the generation of the upper and lower sidebands of the carrier signal 14. Frequency resolution for the system is directly related to the number of bits in the input digital number and for a number of n bits a quantization of $2^n$ frequencies is available.

The input numbers are integrated in the digital integration circuit 10 to provide the phase function $\phi$ on signal line 11. As explained in the "Background of the Invention," the frequency of the carrier signal may be controlled by phase modulation utilizing the function $\phi(t)$. However, if an integration first proceeds the phase modulation, as performed by circuit 10, the modulation is a frequency modulation directly related to the information signal f(t) since at every instant $\phi = 2\pi \int f(t)dt$.

This transformation results in the output of the $\phi$ function to the digital quadrature circuit 12 which splits the function into the cos $\phi$ and $\pm$sin $\phi$ components. The components at the output signal lines 13, 15 are digital numbers if the quadratures are to be synthesized digitally or are analog quantities if the synthesis is to be performed in the analog form. The sign of the digital input number remains with the sin $\phi$ component, at this juncture, for the particular sideband desired.

The quadrature synthesis circuitry which comprises even numbered blocks 14–22 will now be more fully described. The generator 14 provides a high frequency carrier signal cos (wt) which is at angular frequency w. The carrier frequency is transformed by the phase shifter 18 into a component shifted 0°, cos (wt), on signal line 17, and a component shifted 90°, sin (wt), on signal line 19. These quadrature components of the carrier are thereafter algebraically multiplied in the multiplication circuits 16 and 20, with the quadrature components $\pm$sin $\phi$, cos $\phi$ which represent the information or control signal.

The products cos $\phi$ cos (wt) via line 21 and $\pm$sin $\phi$ sin (wt), via line 23, are algebraically summed in the combination circuit 22 to provide the synthesized resultant output frequency, cos (wt$\pm\phi$), on signal line 25. The bandpass filter 24 substantially eliminates unwanted alias frequencies in the analog embodiment. The output may thereafter be amplified.

For an analog embodiment of the frequency synthesis circuitry the preferred multiplication circuitry will be conventional double balanced mixers with the carrier frequency switching the phase functions of cos $\phi$, $\pm$sin $\phi$. The carrier frequency will be generated by a stabilized rf oscillator. As previously indicated, the stability of the output signal will depend on the generation of a nonvarying carrier. The phase shifter circuit will employ an rf hybrid for the 90° shift of a singular frequency w and the combination circuit will comprise a linear rf power combiner.

It is to be noted that this analog synthesis will be most useful in high frequency applications where the carrier is in the MHz range or above. For a VFO operating in this range the passband and hence operating frequencies are preferred to be about 100 KHz although wider bandwidths are possible.

There has been shown the quadrature synthesis of one particular trignometric function cos (wt$\pm\phi$). In a similar manner by rearranging the inputs to the multipliers the synthesis could have proceeded according to the Identity:

sin $\phi$ cos (wt)$\pm$cos $\phi$ sin (wt)

=sin (wt$\pm\phi$)

or any other quadrature identity. In fact, other quadrature synthesis comprising permutations and combinations of the basic components are available from the circuitry described and can be used for the desired applications.

Figure 2:
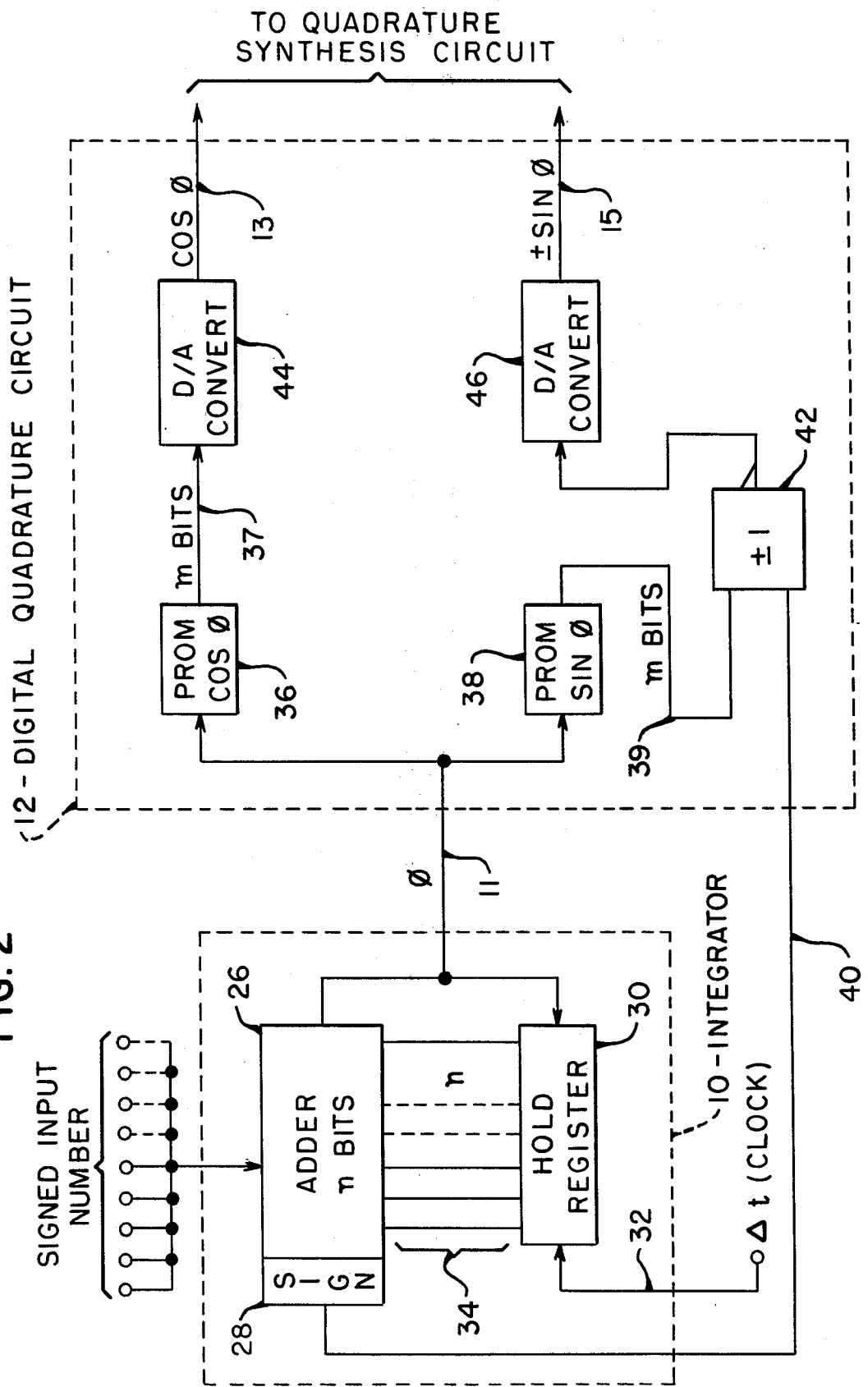
FIG. 2 is a detailed system diagram of the digital quadrature circuit and the digital integrator circuit illustrated in FIG. 1.

With reference now to FIG. 2, the digital integration circuitry 10 and the digital quadrature circuitry 12 will be more fully explained. The digital integration circuit 10 comprises a full adder 26 of at least n bits, and a sign bit storage 28, the output of which is connected via register line 34 to a hold register 30 of equal bit capacity. The output of the adder 26, which is the phase function $\phi$, at any point in time is also utilized for a feedback input to the register 30. The hold register 30 is clocked or incremented to output its contents to the adder 26 by a square wave input signal (clock) which is applied to line 32.

As a signed digital number is inputted to the adder 26 in either a serial or parallel bit stream, it is held or latched into the adder inputs until it is desired to change the output frequency of the oscillator. At the next clock cycle the output of the register 30 is added to the digital number in the adder and is also outputted over line 11 as the phase function $\phi$. The resultant sum is additionally restored into the hold register 30 where the cycle repeats upon the next clock input. The integration will continue until the hold register 30 overflows and begins the cycle again. The frequency of the integration, or the integration time increment $\Delta t$, is fixed to be the clock frequency.

Since it is envisioned that the digital integrator output numbers are in a modulo $2\pi$ form each overflow represents a complete phase cycle from 0° to 360° or a complete phase cycle from a non zero starting value. Each increment of the clock then represents the amount of phase shift of phase function $\phi$ according to the magnitude of the digital input number. In this manner the digital input number has been converted into a digital form of a rotating phasor $\phi$ which is a function of time.

As was stated previously the instantaneous change of frequency from the output of the synthesis Wi is equal to $d\phi/dt$ or in the above embodiment $\Delta\phi/\Delta t$ wherein $\Delta\phi$ is the magnitude of the digital input number, and t is the integration increment provided by the clock frequency. It is seen that the phase resolution for an n bit digital number is then $2\pi/2^n$ and the amount of frequency shift for each phase increment is a direct relation to the clock frequency. In relating frequency range to resolution it can be said that the higher the clock frequency the greater the range of frequency output and for additional bits the higher the resolution of frequencies within the range.

The phase function $\phi$ is directed to the digital quadrature circuit 12, which circuit in the preferred embodiment comprises a programmable read only memory (PROM) 36 and a programmable read only memory 38. Conveniently the PROM 36 contains within its memory spaces a "look up" table of the cos function and the PROM 38 contains within its memory spaces a "look up" table of the sine function.

For each value of the digital input phasor $\phi$ the PROM 36 has a value stored which will convert $\phi$ to cos $\phi$ and similarly the PROM 38 has a value stored which will convert $\phi$ to sin $\phi$. Since the numbers $\phi$ are in polar form, the conversion will be such that the digital outputs from the PROMS 36, 38 will be in rectangular coordinates. Thus as the function $\phi$ varies between $-\pi$ and $+\pi$ the cos $\phi$ values will vary between $-1$ to 0 to $+1$ to 0 to $-1$ and the sin $\phi$ values will vary between 0, $-1$, 0, 1, 0. The number of output bits (m) from the PROMS 36, 38 can be more or less than the number of bits in the function $\phi$ and can be accomplished either synchronously or asynchronously. However, it is preferred that the conversion output be at least an equivalent number of bits so that phase resolution is not lost and that the conversion does not delay the signal appreciably so as to cause a loss in frequency range.

Other memory components could be useful in this type of conversion. From the previous discussion it is apparent a "look up" table could be stored in a random access memory or burned into a read only memory for an equivalent conversion. Additionally, a code conversion circuit, following the functional rules of the cosine and sine, could be developed to operate synchronously with the clock. Thus many polar to rectangular converter circuits, for forming the quadrature phases of an input phase function $\phi$ by digital conversion, could be utilized.

The phased components cos $\phi$ and sin $\phi$ are outputted from the converters 36 and 38, via the signal lines 37, and 39, respectively, and may be used in a digital quadrature synthesis directly. If the analog quadrature synthesis is desired however, digital-to-analog converters 44 and 46 can provide the necessary conversion in form.

A facile method of generating the $-\sin \phi$ function from the input sign is to use an Exclusive OR combination of the sin $\phi$ in 2's complement arithmetic and the sign bit 28. The sign bit 28 can be outputted as a single signal via line 40 to an Exclusive OR gate 42 if the bit stream from the converters are serial or comprise parallel combinations of gates and lines for m parallel bits. Alternatively, the adder 26 could provide a count down instead of the count up for negative inputs to produce the change in the sign of sin $\phi$ as previously described. In this embodiment it would function as a subtractor and the gate 42 would not be necessitated The output signal from the Exclusive OR gate 42 is directed to the input of the digital-to-analog converter 46.

With reference now to FIG. 4 there is illustrated graphically the signals produced by the circuitry of FIG. 2. FIG. 4A is the output of the digital integrator for a $+1$ input number where the number of bits n is equal to four. In this embodiment there are a maximum of sixteen output frequencies from the VFO and the clock will cycle the register and output from 0–15 decimal, in increments of $+1$. Once the overflow is reached the cycle will repeat as is shown in the second stair in FIG. 4A. The second stair illustrates the output when the digital number is a $+2$ and illustrates that $\Delta\phi$ changes 2 counts and the overflow occurs every eight clock cycles.

The ordinate axis is divided into $\Delta\phi$ increments over a modulo $2\pi$ interval $-\pi$ to $+\pi$ so as to cause the phase ramps to repeat as cyclic functions. The polar function was chosen because the integrator output was to be digital numbers. If the cyclic functions were not chosen, the phase ramps would increase toward infinity as the integration continued and thus require an integrator of an infinite bit size.

Figure 4A:
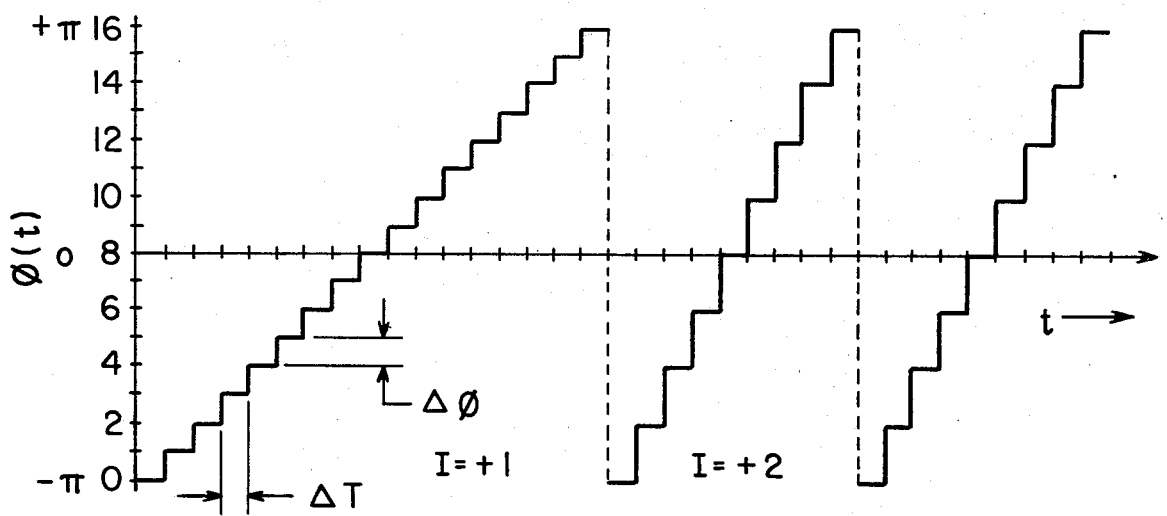
FIGS. 4A to 4D are pictorial representations of signals at various positions and times for the variable frequency oscillator illustrated in FIG. 1.
Figure 4B:
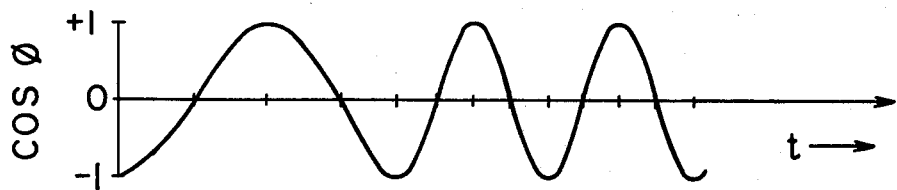
Figure 4C:
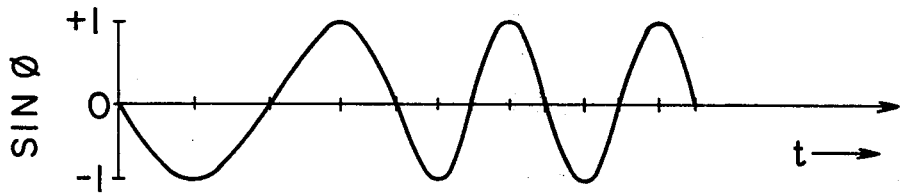

FIGS. 4B and 4C illustrate the analog signals on lines 13 and 15 (FIG. 1) respectively, for the cos $\phi$ and sin $\phi$ components of the circuit after polar to rectangular conversion. These signals are the input control signals to the multiplication circuits 16 and 20 and represent the quadrature phases of the control signal $\phi$.

Figure 4D:
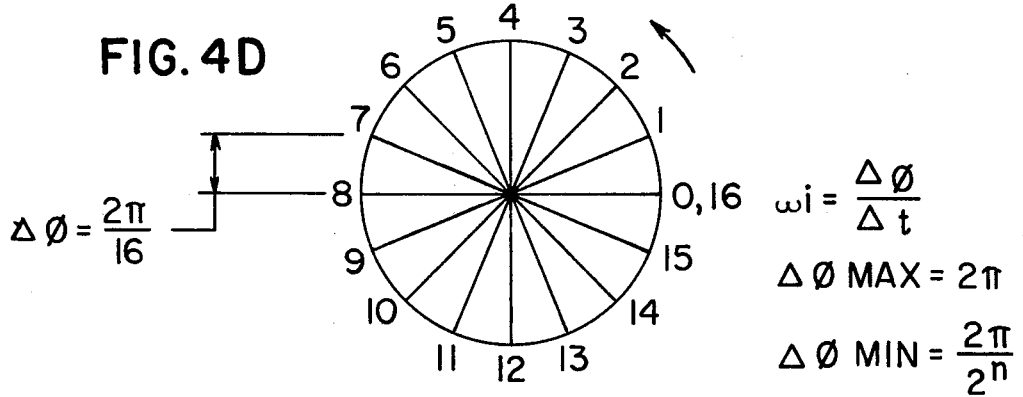

FIG. 4D illustrates a digital phasor representation of the integration circuit output for the case where the input word was a $+1$. The phasor rotates at a frequency $\Delta\phi/\Delta t$ and in equal increments of $2\pi/16$ of phase.

The circuitry described illustrates an advantageous method of quadraturizing a wide band control signal for quadrature synthesis. All frequencies in this quantization by digital means are converted with equal linearities into the components of cos $\phi$ and sin $\phi$. The output frequency from the VFO can be highly stable as the digital conversions provide a repeatability not found in analog quadrature circuits over such a range of frequencies. The errors of the conversion and synthesis can be further reduced by deriving the clock frequency, used in the integration function, from the same source as the rf carrier generator 14.

Further, because of the digital form of the signals the available output frequencies may be any of the quantized digital input numbers, even zero, i.e., DC modulation, or no frequency shift of the carrier, which is highly desirable in some applications.

FIG. 3 is a detailed block diagram of a further embodiment of the invention where the quadrature synthesis of the output frequency is provided digitally. As was true for the control signal $\phi(t)$, so also can the carrier frequency signal cos (wt) be represented by a digital number whose magnitude is indicative of a frequency w. With a digital quantization of the carrier in this manner, additional flexibilities are obtained by being able to input variable carrier frequencies about which the control signal will operate. Thus an m bit representation of the carrier, of angular frequency w, is inputted to a digital integrator circuit 48 over a line 47. The integrator circuit 48 is of similar design to the integrator circuit 10 of FIG. 1 with an appropriate clock frequency chosen.

In the manner previously described, the digital integrator circuit 48 converts the digital number w into a rotating phaser which is transmitted via signal line 49 to a digital quadrature circuit 50.

The quadrature circuit 50 is operationally similar to the quadrature circuit 13 and operates to separate the phase function, produced by the integration, into the quadrature components cos (wt) and sin (wt). Thereafter, the outputs of the quadrature circuit 50 are multiplied by the quadrature components, of the signal $\phi$, from circuit 12, in multipliers 52 and 54. The multiplication circuits 52 and 54 perform a conventional M×N bit multiplication on the digital quadrature components. Thus the multiplication circuit 52 receives an m bit digital number representing cos (wt) via signal line 51 and a digital number of n bits representing cos $\phi$ via signal line 13 to produce the product cos $\phi$ cos (wt). Likewise, the multiplication circuit 54 provides the product ±sin $\phi$ sin (wt) resultant as the combination of the other quadrature components inputted via signal lines 15, 59 respectively.

An Adder circuit 56, having inputs from signal lines 53 and 55, sums the two products of the multiplication circuits together to synthesize the output frequency as a digital number: cos (wt±$\phi$) at 57.

The digital arithmetic used is not critical and many of the conventional digital multipliers and adders can be used advantageously. Multiplication round offs may be used to keep bits sizes to manageable lengths if significant and thus resolution is maintained.

The digital synthesis number, cos (wt±$\phi$) at output 57 is most useful in various circuit applications where further processing of the VFO output signal proceeds digitally or as the direct input to a general purpose processor.

Additionally, the number synthesized by this digital quadrature synthesis may be converted to its analog counterpart by a linear D/A converter of conventional design.

This digital embodiment is particularly advantageous as it provides the control of a carrier frequency w of m bits by a control signal $\phi(t)$ of n bits where n may be much less than m. This then is an optimal model of a VFO where a range of frequencies about a carrier is desired. The digital embodiment retains the advantages previously discussed for the analog implementation.

While there have been shown what is considered to be the preferred embodiments of the invention, it will be understood that many changes and modifications, obvious to one skilled in the art, may be made therein without departing from the essential spirit of the invention. It is intended, therefore, in the annexed claims to cover all such changes and modifications which fall within the true scope of the invention.

What is claimed is:

1. A variable frequency oscillator comprising:
    digital circuit means, responsive to a digital input signal for generating a control signal and a quadrature control signal whereby a band of control signals and quadrature control signals are provided;
    means for providing a carrier signal; and
    quadrature synthesis means for receiving said provided carrier signal and for generating a quadrature carrier signal therefrom and for combining said carrier signal and said quadrature carrier signal with said control signal and said quadrature control signal, respectively, to provide a multiplicity of output frequencies.

2. A variable frequency oscillator as defined in claim 1 wherein said digital circuit means is comprised of:
    a digital integrator means for receiving said input signal and for providing an integration signal indicative of the integrated value of said input signal; and
    digital quadrature circuit means for converting said integration signal into said control signal and said quadrature control signal.

3. A variable frequency oscillator as defined in claim 2 wherein said digital quadrature circuit means is comprised of:
    memory means for outputting digital sine and cosine values as a function of the magnitude of said integration signal; and
    means for converting said digital sine and cosine values into a first analog signal corresponding to said control signal and a second analog signal corresponding to said quadrature control signal.

4. A variable frequency oscillator as defined in claim 2 and further comprising:
    sign means operatively associated with said integrator means for detecting and storing the sign of said input signal; and
    means responsive to the sign stored by said sign means for applying the stored sign to said control signal.

5. A variable frequency oscillator as defined in claim 2 wherein said digital integration means is comprised of:
    an adder for receiving said input signal in groups of bits and for adding a presently received group of bits to a preceding received group of bits and for providing an output which is the sum thereof; and
    storage means for storing the output from said adder and from feeding back to said adder said output for addition to a subsequent received group of bits of input signal, said integration signal being taken from the output of said adder.

6. A variable frequency oscillator comprising:
    an integrator for converting a digital number into a polar signal;

digital quadrature circuit means for converting said polar signal into a pair of quadrature related rectangular signals;
means for generating a pair of quadrature related carrier signals;
multiplier means for multiplying said rectangular signals by like phases of said carrier signals to provide two product signals; and
means for combining the two product signals from said multiplier means to provide an oscillator output.

* * * * *